ENCODER HAVING AN ANALOG INPUT SIGNAL CENTERING ARRANGEMENT

Filed Nov. 9, 1967 2 Sheets-Sheet 1

Inventor
MALCOLM E. GABRIEL
By Alfred C. Hill
Agent

ENCODER HAVING AN ANALOG INPUT SIGNAL CENTERING ARRANGEMENT

Filed Nov. 9, 1967 2 Sheets-Sheet 2

Inventor
MALCOLM E. GABRIEL
By Alfred C. Hill
Agent

United States Patent Office 3,495,238
Patented Feb. 10, 1970

3,495,238

ENCODER HAVING AN ANALOG INPUT SIGNAL CENTERING ARRANGEMENT

Malcolm Edward Gabriel, Basildon, Essex, England, assignor to International Standard Electric Corporation, New York, N.Y., a corporation of Delaware Filed Nov. 9, 1967, Ser. No. 681,622
Claims priority, application Great Britain, Nov. 22, 1966, 52,152/66
Int. Cl. G08c 19/00
U.S. Cl. 340—348 10 Claims

ABSTRACT OF THE DISCLOSURE

An encoder producing a code of the symmetrical binary code type employs a control loop which automatically adjusts the bias applied to the encoder input so that zero of the input analog signal coincides with the center of the code structure. The control loop includes one or more counters to increase the gain in that part of the control loop where the signals are in digital form. The digital amplification is based on statistical considerations of the polarity of each of a plurality of code groups.

BACKGROUND OF THE INVENTION

This invention relates to encoders for encoding analog signals into a symmetrical binary code and in particular to an automatic control circuit for such encoders.

The advantages of using the symmetrical binary code for the encoding of speech signals in Pulse Code Modulation (PCM) telecommunication systems are well known. In this code the first digit indicates the polarity of the analog signal to be encoded, the remaining digits of the code indicating the amplitude of the signal. It is also known to be advantageous to give encoders a non-linear characteristic and to adjust the size of the quantizing steps in accordance with the amplitude of the analog signal to be coded.

In such coders it is important that the zero of the input signal should coincide with the center of the code structure if maximum companding advantage is to be derived.

The centering of the input signal in PCM systems having a free channel period, allocated, for example, for synchronizing purposes, can be carried out during that period. This is because during this period the encoder is not used and can be presented with a zero reference signal. Any output appearing during this period, therefore, indicates the presence of any offset, thus permitting a feedback correction mechanism to be employed.

SUMMARY OF THE INVENTION

An object of the present invention is to provide an encoder system having a feedback control arrangement for centering of the input analog signal when no free period is available.

A feature of the present invention is the provision of an encoder system comprising an encoder to convert analog signals to successive code groups, each of the code groups having a polarity indicating digit and a plurality of digits representing the magnitude of an analog signal; first means coupled to the digital output of the encoder to examine the polarity of each of the code groups; second means coupled to the first means to assign a polarity to a block of the code groups in accordance with the polarity distribution of each of the code groups in the block; and third means coupled to the second means and the analog input of the encoder responsive to the assigned polarity to equalize the number of the code groups in the block having opposite polarities.

BRIEF DESCRIPTION OF THE DRAWING

The above mentioned and other features and objects of this invention will become apparent by reference to the following description taken in conjunction with the accompanying drawings, in which.

DESCRIPTION OF THE PREFERRED EMBODIMENTS

Figure 1:
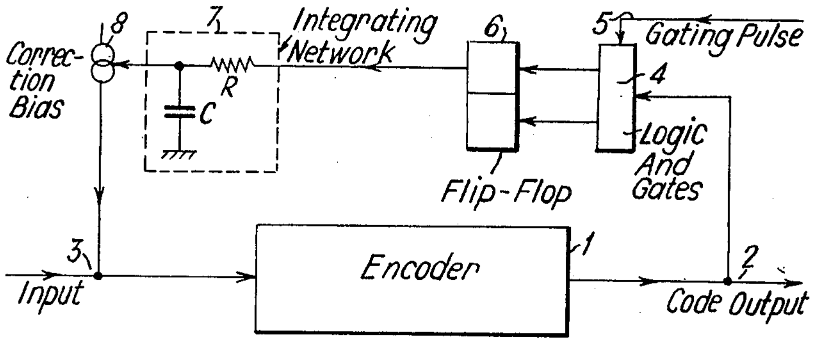
Fig. 1. (Prior Art)
FIG. 1 shows in block diagram an encoder system of the prior art.

A known control circuit for centering a symmetrical encoder is shown in FIG. 1. The encoder itself does not form part of the invention and is indicated by the block 1. Any known type may be used provided it will encode an analog signal into a symmetrical binary code. An encoder of this type is described in my copending U.S. application, Ser. No. 652,053, filed July 10, 1967.

The automatic centering circuit of FIG. 1 comprises the feedback path connected between output circuit 2 of the encoder and the analog signal input circuit 3. The polarity digit of the coded output signal, or code group, is examined by logic AND gates 4 to which gating pulses are applied by conductor 5 from a timing generator (not shown). This gating pulse is time coincident with the polarity digit of each of the code signals, or channel codes in a time division multiplex system. The output of the gate 4 is connected to bistable circuit 6. The arrangement is such that when the examined polarity digit of a code signal indicates a positive amplitude the bistable is in one condition and it changes over to the other condition when the polarity digit of a code signal indicates a negative amplitude. A square wave of constant amplitude will therefore appear at the output of bistable circuit 6. The mark-space ratio of this wave will depend on the ratio of positive and negative code signals.

Since the analog signal to be encoded is an alternating current signal and has no D.C. component present, the ratio of positive and negative going waves in a perfectly aligned encoder, when examined over a sufficiently long period of time, will be unity. The square wave is integrated in integrating network 7 comprising capacitor C and resistor R. The analog output of the integrating network 7 is used to control bias generator 8. The polarity of this bias is chosen to reduce the offset of the encoder.

The circuit of FIG. 1 suffers from the disadvantage that if the time constant of the integrating circuit is short the assumption that there will be an equal number of positive and negative channels in a given period of time will not hold. A further disadvantage of the circuit is that the "gain" of the control loop, which can be defined as the change of the mark-space ratio of the signal at the output of bistable circuit 6 for a unit offset in the coded output signal at 2, decreases as the system loading is increased. By system loading is meant the product of the number of channels used and the amplitude of signal in each channel.

In order to demonstrate the dependence of the deviation of the mark/space ratio from unity on system loading, consider the case when all channels are equally loaded with maximum amplitude, i.e., the coder excursion is $2Q$ quantizing steps and that each level of each channel occurs with equal probability. Let $p$=probability of each channel code being positive; and $q$=probability of each channel code being negative.

Assume the encoder has a negative offset equal to one quantum step. We then have $$p=\frac{Q+1}{2Q}$$

and $$q=\frac{Q-1}{2Q}$$

and $$\frac{p}{q}=\frac{Q+1}{Q-1}=1+\frac{2}{Q-1}$$

which means that on the assumption that $Q>1$ the deviation of the ratio from unity is inversely proportional to the number of levels excited.

The above expression is approximate only, since it does not take into account the fact that when the encoding characteristic is non-linear the effective number of "linear" levels may be very much greater than the actual, non-linear levels. The assumption that all levels occur with equal probability is also an oversimpification.

In order to combat this effect it is necessary to have a high gain in the control loop. This gain could be provided in the analogue part of the feedback path, i.e., after the integrating circuit. However, as it is necessary to limit the "droop" caused by the integrating network to a fraction of a quantum step, any gain inserted after the integrating network will amplify the "droop" unless the time constant of the integrating network is increased accordingly. Clearly, therefore, there is a practical limit to the gain that may be inserted after the integrating network i.e., in the analog part of the feedback circuit.

The gain of the feedback circuit can also be increased before the integrating network, i.e., in the digital part of the circuit.

Figure 2:
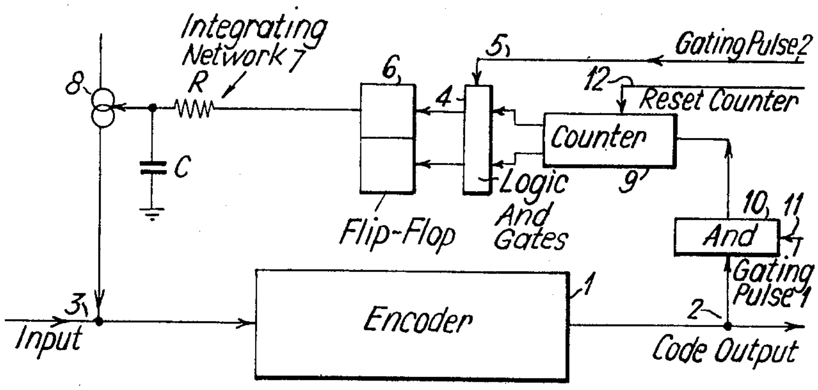
FIG. 2 shows a block diagram of one embodiment of the encoder system according to the principles of the present invention.

In the arrangement according to FIG. 2, the error signal information derived from the inspection of the polarity digit of the successive channel codes appearing at the output of the encoder is processed digitally and thereby "amplified." The term "amplified" must be taken to mean that for a given disparity between positive and negative channel codes the inclusion of digital processing into the feedback path will result in increasing the deviation from unity of the mark/space ratio of the signal appearing at the output from bistable unit 6.

The basic idea is to form groups of $n$ channels and to assign to each group the polarity of the majority of channels in that group. This idea is carried into effect by including in the feedback path between the output from the encoder and the input to gates 4 bistable circuit counter 9 and an associated AND gate 10 which is controlled by a timing pulse applied to conductor 11. This timing pulse is generated by a timing generator (not shown) to be time coincident with the polarity digit of each code signal, or channel code. The number of channels of a given polarity is registered on the counter. After the final channel within the group has been inspected, the counter register is examined by gates 4 activated by a timing pulse from a timing generator (not shown) succeeding the final channel of the group of channels, to see whether or not a count greater than one half the number of channels in the group of that polarity has been reached. If one half the count of counter 9 is exceeded the last stage of counter 9 is in a "1" condition. On the other hand, if the count is less than one half of the count the last stage of counter 9 is a "0" condition. If this is the case bistable circuit 6 is set to one state, if not bistable 6 is set to the other state. The counter is then reset by a pulse on conductor 12 from a timing generator (not shown). The output from bistable 6 is applied to integrating network 7 which serves the same function as previously described.

It will now be shown that the circuit according to FIG. 2 provides higher "gain" in the feedback path than the circuit of FIG. 1.

In order to determine the mark/space ratio of bistable circuit 6 for a given offset in the encoder, it is necessary to determine the probability of a group of $n$ channels having more positive than negative channel codes in terms of the probability of each channel code within a group being positive. Since the polarity of a group has been taken as that of the majority of channel codes within that group $n$ is chosen to be an odd number.

The group will be positive if:

(1) $\frac{n+1}{2}$ channel codes are positive (2) $\frac{n+2}{2}$ channel codes are positive ($n$) n channel codes are positive Case (1) when $$\frac{n+1}{2}$$

channel codes are positive can occur in $${}^{n}C_{\left(\frac{n+1}{2}\right)}$$

ways.

Therefore, the probability of there being $$\frac{n+1}{2}$$

positive channels will be $$=p^{\left(\frac{n+1}{2}\right)}\cdot q^{\left(\frac{n-1}{2}\right)}\cdot {}^{n}C_{\left(\frac{n+1}{2}\right)}$$

Similarly for case (2) the probability of there being $$\frac{n+3}{2}$$

positive channels will be $$=p^{\left(\frac{n+3}{2}\right)}\cdot q^{\left(\frac{n-3}{2}\right)}\cdot {}^{n}C_{\left(\frac{n+1}{2}\right)}$$

Therefore, the probability $p_n$ of a group of $n$ channels having more positive channels than negative channels is given by $$p_n=p^{\left(\frac{n+1}{2}\right)}\cdot q^{\left(\frac{n-1}{2}\right)}\cdot {}^{n}C_{\left(\frac{n+1}{2}\right)}+p^{\left(\frac{n+3}{2}\right)}\cdot q^{\left(\frac{n+3}{2}\right)}\cdot {}^{n}C_{\left(\frac{n+3}{2}\right)}+\ldots+p^{n}$$

Similarly the probability $q_n$ of the group having more negative than positive channels is given by $$q_n=p^{\left(\frac{n-1}{2}\right)}\cdot q^{\left(\frac{n+1}{2}\right)}\cdot {}^{n}C_{\left(\frac{n-1}{2}\right)}+p^{\left(\frac{n-3}{2}\right)}\cdot q^{\left(\frac{n+3}{2}\right)}\cdot {}^{n}C_{\left(\frac{n-3}{2}\right)}+\ldots q^{n}$$

Therefore, if the "polarity" of the groups are examined over a long period of time the ratio of positive groups to negative groups will be $$\frac{pn}{qn}=\frac{p^{\left(\frac{n+1}{2}\right)}\cdot q^{\left(\frac{n-1}{2}\right)}\cdot {}^{n}C_{\left(\frac{n+1}{2}\right)}+p^{\left(\frac{n+3}{2}\right)}\cdot q^{\left(\frac{n-3}{2}\right)}\cdot {}^{n}C_{\left(\frac{n+3}{2}\right)}+\ldots p^{n}}{p^{\left(\frac{n-1}{2}\right)}\cdot q^{\left(\frac{n+1}{2}\right)}\cdot {}^{n}C_{\left(\frac{n-1}{2}\right)}+p^{\left(\frac{n-3}{2}\right)}\cdot q^{\left(\frac{n+3}{2}\right)}\cdot {}^{n}C_{\left(\frac{n-3}{2}\right)}+\ldots q^{n}}$$

Dividing throughout by $q^n$ there is obtained $$\frac{pn}{qn}=\frac{\left(\frac{p}{q}\right)^{\left(\frac{n+1}{2}\right)}\cdot{}^{n}C_{\left(\frac{n+1}{2}\right)}+\left(\frac{p}{q}\right)^{\left(\frac{n+3}{2}\right)}\cdot{}^{n}C_{\left(\frac{n+3}{2}\right)}+\ldots+\left(\frac{p}{q}\right)^{n}}{\left(\frac{p}{q}\right)^{\left(\frac{n-1}{2}\right)}\cdot{}^{n}C_{\left(\frac{n-1}{2}\right)}+\left(\frac{p}{q}\right)^{\left(\frac{n-3}{2}\right)}\cdot{}^{n}C_{\left(\frac{n-3}{2}\right)}+\ldots+1}$$

This value of $pn/qn$ equals the average mark to space ratio of bistable circuit 6.

Figure 4:
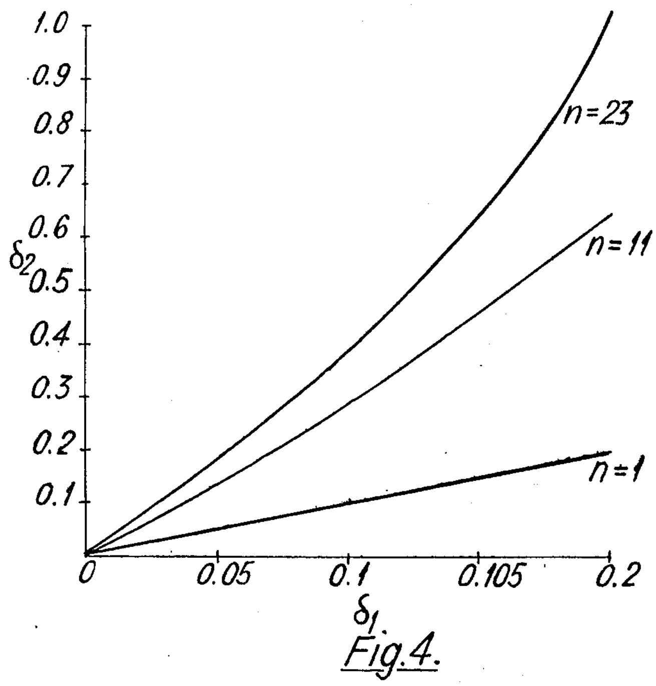
FIG. 4 shows characteristic curves of the systems according to the present invention.

If we designate by $\delta_1$ the deviation from unity of the mark to space ratio of bistable circuit 6 in the arrangement of FIG. 1 for an offset of one quantum step and by $\delta_2$ the deviation of the mark to space ratio for the arrangement according to FIG. 2, a comparison between the two circuits can be obtained by plotting $\delta_2$ as a function of $\delta_1$ for different values of $n$. This is shown in FIG. 4 from which it is apparent that the "gain" of the feedback path increases with $n$, i.e., the number of channel codes per group. It will also be noted that when $n$ is large the gain increases with the magnitude of the offset.

Figure 3:
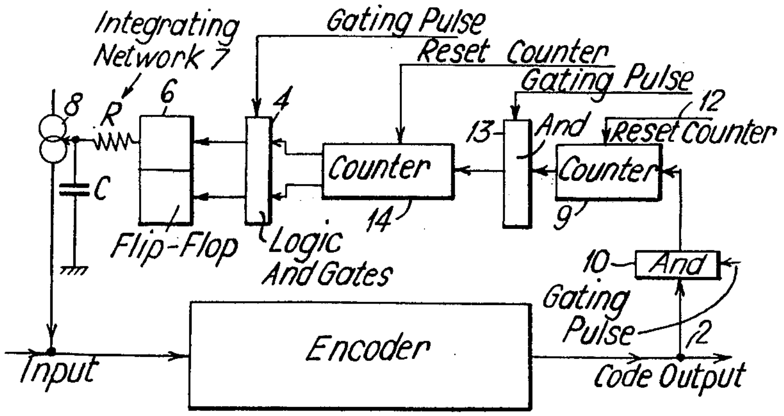
FIG. 3 shows a block diagram of a modification of the system of FIG. 2.

The gain of the feedback path can be increased still further by combining a number $m$ of groups of channel codes to a block of channel codes and allocating to the whole block the polarity of the majority of groups in the block. This is shown in the circuit of FIG. 3. A logic AND gate 13 and a counter 14 are added to the circuit of FIG. 2. Counter 14 registers the number of groups within a block of channel codes having the given polarity and actuates bistable circuit 6 when this number is greater than one-half of the total number of groups. If the number of counts is less than one-half, bistable 6 remains in its previous condition. When $m$ groups have been examined counter 14 is reset by a timing pulse. The logic gate 13 is opened every time the store of counter 9 is examined, i.e., every time $n$ channel codes have been examined. As before the timing and reset pulses with appropriate timing for the gates 10, 13 and 4 and counters 9 and 14 are generated by a timing generator (not shown).

I claim:

1. An encoder system comprising:
   - an encoder to convert analog signals to successive code groups, each of said code groups having a polarity indicating digit and a plurality of digits representing the magnitude of an analog signal;
   - first means coupled to the digital output of said encoder to examine the polarity of each of said code groups;
   - second means coupled to said first means to assign a polarity to a block of said code groups in accordance with the polarity distribution of each of said code groups in said block; and
   - third means coupled to said second means and the analog input of said encoder responsive to said assigned polarity to equalize the number of said code groups in said block having opposite polarities.

2. A system according to claim 1, wherein said first means includes:
   - a gate circuit coupled to the digital output of said encoder activated during time slots allocated to said polarity indicating digit of each of said code groups.

3. A system according to claim 1, wherein said second means includes:
   - a binary counter coupled to said first means to count the number of said code groups having a given polarity.

4. A system according to claim 1, wherein said third means includes:
   - fourth means coupled to said second means to generate a digital control signal determined by the polarity of said block,
   - fifth means coupled to said fourth means to convert said control signal to an analog bias signal, and
   - sixth means coupled to said fifth means and the analog input of said encoder responsive to said bias signal to equalize the number of said code groups in said block having opposite polarities.

5. A system according to claim 1, wherein
   - said first means includes
     - a gate circuit coupled to the digital output of said encoder activated during time slots allocated to said polarity indicating digit of each of said code groups;
   - said second means includes
     - a binary counter coupled to said gate circuit to count the number of said code groups having a given polarity; and
   - said third means includes
     - bistable means coupled to said binary counter set to one of its two conditions depending upon the polarity of said block to generate said control signal,
     - integrating means coupled to said bistable means to produce in response to said control signal said bias signal, and
     - means coupled to said integrating means and the analog input of said encoder responsive to said bias signal to control the bias on said analog input of said encoder.

6. A system according to claim 1, wherein said block includes:
   - $m$ groups of said code groups, each of said $m$ groups including $n$ of said code groups, where $m$ and $n$ are odd integers; and
   - said second means assigns a polarity to each of said $m$ groups determined by the polarity of a majority of said $n$ of said code groups in each of said $m$ groups and assigns a polarity to said block determined by the polarity of a majority of said $m$ groups.

7. A system according to claim 6, wherein said first means includes
   - a gate circuit coupled to the digital output of said encoder activated during time slots allocated to said polarity indicating digit of each of said code groups.

8. A system according to claim 6, wherein said second means includes
   - a first binary counter coupled to said first means to count the number of said $n$ of said code groups contained in each of said $m$ groups having a given polarity, and
   - a second binary counter coupled to said first binary counter to count the number of said $m$ groups having a given polarity.

9. A system according to claim 6, wherein said third means includes
   - fourth means coupled to said second means to generate a digital control signal determined by the polarity of said $m$ groups,
   - fifth means coupled to said fourth means to convert said control signal to an analog bias signal, and
   - sixth means coupled to said fifth means and the analog input of said encoder responsive to said bias signal to equalize the number of said $m$ groups having opposite polarities.

10. A system according to claim 6, wherein
    - said first means includes
      - a gate circuit coupled to the digital output of said encoder activated during time slots allocated to said polarity indicating digit of each of said code groups;
    - said second means includes
      - a first binary counter coupled to said gate circuit to count the number of said $n$ of said code groups contained in each of said $m$ groups having a given polarity, and
      - a second binary counter coupled to said first binary counter to count the number of said $m$ groups having a given polarity; and
    - said third means includes
      - bistable means coupled to said second binary counter set to one of its two conditions depending upon the polarity of the majority of said *m* groups, integrating means coupled to said bistable means to produce in response to said control signal said bias signal, and means coupled to said integrating means and the analog input of said encoder responsive to said bias signal to control the bias on said analog input of said encoder.

References Cited

UNITED STATES PATENTS

| | | | |
|---|---|---|---|
| 3,348,031 | 10/1967 | Russell et al. | |
| 3,349,177 | 10/1967 | Cattermole | 340—352 |

THOMAS A. ROBINSON, Primary Examiner

U.S. Cl. X.R.

324—77; 328—151